United States Patent [19]

Kilian

[11] 4,451,795
[45] May 29, 1984

[54] CIRCUIT ARRANGEMENT WITH CONTROLLABLE TRANSFER CHARACTERISTIC AT HIGHER FREQUENCIES

[75] Inventor: Ernst A. Kilian, Hamburg, Fed. Rep. of Germany

[73] Assignee: U.S. Philips Corporation, New York, N.Y.

[21] Appl. No.: 301,159

[22] Filed: Sep. 11, 1981

[30] Foreign Application Priority Data

Aug. 10, 1980 [DE] Fed. Rep. of Germany ....... 3037986

[51] Int. Cl.³ .......................... H03F 1/34; H03G 3/30
[52] U.S. Cl. .................................... 330/107; 330/282; 330/294
[58] Field of Search .................. 330/107, 109, 86, 282, 330/294; 333/28 R, 28 T

[56] References Cited

U.S. PATENT DOCUMENTS

| | | | |
|---|---|---|---|
| 3,177,350 | 4/1965 | Abbott | 330/86 |
| 4,099,134 | 7/1978 | Schroder | 330/109 |
| 4,107,622 | 8/1978 | Toyomaki | 330/109 |
| 4,262,260 | 4/1981 | Tamura | 330/294 |
| 4,363,001 | 12/1982 | Suzuki et al. | 330/107 |

Primary Examiner—James B. Mullins
Assistant Examiner—Gene Wan
Attorney, Agent, or Firm—Robert T. Mayer; Bernard Franzblau

[57] ABSTRACT

A treble-control circuit which exhibits a particularly low noise level and which can be controlled digitally in a simple manner. The treble control circuit comprises an amplifier having an output connected to the arrangement of a capacitor in series with a resistor chain. The tappings of said resistor chain are connected to an inverting input of the amplifier via a first switch and to the output of the treble control circuit via a second switch.

9 Claims, 5 Drawing Figures

CIRCUIT ARRANGEMENT WITH CONTROLLABLE TRANSFER CHARACTERISTIC AT HIGHER FREQUENCIES

BACKGROUND OF THE INVENTION

This invention relates to a circuit arrangement for influencing the transfer characteristic at higher frequencies, in particular a treble control device, the input signal being applied to an amplifier with variable frequency-dependent negative feedback.

Such a circuit arrangement is known from U.S. Pat. 3.908,172. By means of this circuit arrangement the gain for high-frequency signals may be increased or decreased, as required, relative to the gain for signals of lower frequencies. The negative feedback is varied the current distribution of two differential amplifiers is in an opposite sense by means of a direct voltage. The inputs of the two differential amplifiers are respectively connected to the signal input or signal output via a frequency-dependent network comprising at least two capacitors and one resistor.

A drawback of circuit arrangements which are based on the variation of the current distribution of two differential amplifiers is that they exhibit a comparatively high noise level. If such a circuit arrangement is constructed as an integrated circuit—as for example the integrated circuit Philips TCA 740—an external connection is then required for each of the two inputs of the input differential amplifier, in addition to those for the input and output of the circuit. The frequency dependent network comprises at least three circuit elements to be connected to the external connections.

SUMMARY OF THE INVENTION

It is an object of the present invention to provide a circuit arrangement of the type mentioned in the opening paragraph which exhibits a reduced noise level and is of simple design.

According to the invention this object is achieved in that the arrangement of a capacitor in series with a resistor chain having a plurality of tappings is connected to the output of the amplifier, and that the tappings are connected to an inverting input of the amplifier via a first switch and to the inputs of a second switch whose output constitutes the output of the circuit arrangement.

If both switches, which each have a plurality of inputs connected to the tappings and a common output, are set to a first switch position in which the full output voltage of the amplifier appears on their outputs, a linear transfer characteristic is obtained. If the full output voltage only appears on the output of the first switch a treble attenuation is obtained, which increases with the dividing resistance of the resistor chain between the output of the amplifier and that input of the second switch which is connected to their common output. However, if the full output voltage of the amplifier only appears on the output of the second switch, a treble boost is obtained, which increases with the resistance value between the output of the amplifier and that input of the switch which is connected to the common output, the negative feedback for high frequencies then being minimal.

In a further embodiment of the invention the two switches are controlled in such a way that one of the two switches always receives the full output voltage of the amplifier.

If, for example, the resistor chain comprises n dividing resistors and each of the two switches has n inputs, of which each time one input may be connected to its output, this yields $n^2$ combinations of switch positions, some of which are redundant because, for example, a treble reduction is fully or partly compensated for by a treble boost. Owing to the steps in accordance with this embodiment the entire treble control range requires only 2n-1 switch positions.

In principle, each switch may be mechanical switch, but this would present the problem of electronically controlling the switches. Therefore, in accordance with a further embodiment of the invention, a semiconductor circuit is employed for the switches. The switch position then can be controlled by a digital data word at its control inputs.

In this respect it is to be noted that from the magazine "Funkschau", 1980, Vol. 5, pages 47–50 a circuit arrangement is known for influencing audio signals, in which circuit arrangement the semiconductor switch is actuated by digital signals. However, this known circuit arrangement only serves as a volume control.

BRIEF DESCRIPTION OF THE DRAWING

The invention will now be described in more detail with reference to the drawing, which shows an embodiment. In the drawing.

DESCRIPTION OF THE PREFERRED EMBODIMENT

Figure 1:
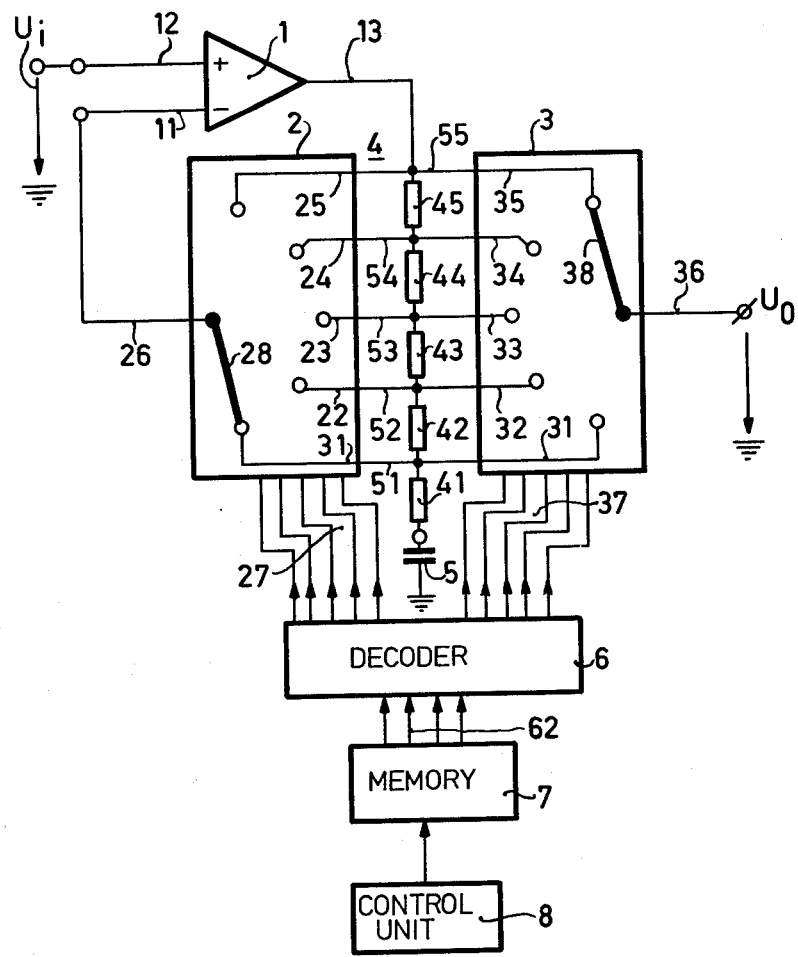
FIG. 1 is a circuit diagram of the circuit arrangement in accordance with the invention.

FIG. 1 shows a circuit arrangement which may be used as a treble control in an audio amplifier to which a loudspeaker is connected. The loudspeaker serves for the reproduction of audio signals supplied by a radio tuner, a record player or the like. The circuit arrangement comprises an operational amplifier 1 with an open-loop gain of 80 dB. The non-inverting input 12 of the op-amp receives the input signal $u_i$. The output terminal 13 of the amplifier is connected to a capacitor 5 via a resistor chain voltage divider 4 comprising five series-connected resistors 41 . . . 45, the other end of said capacitor being connected to ground. The output 13 of the amplifier and the four junctions between the resistors 41 . . . 45 are provided with five tappings 55 . . . 51, which are connected to the five input terminals 25 . . . 21 and 35 . . . 31 respectively of two switches 2 and 3. Depending on the switch positions of said switches, which are symbolically represented by a switch arm 28 and 38 respectively, one of the control inputs 21 . . . 25 or 31 . . . 35 is connected to the respective output terminal 26 or 36 of the relevant switch 2 or 3. Which input is connected to the output 26 or 36 is determined by a digital data word applied to the five control inputs 27 or 37 of the respective switches 2 and 3.

The output 26 of the switch 2 is connected to the inverting input 11 of the amplifier 1, whereas the output 36 of the switch 3 constitutes the output of the circuit arrangement on which the output signal $u_o$ is available. The higher frequencies are then influenced in a different way depending on the switch positions of the switches 2 and 3.

Figure 2:
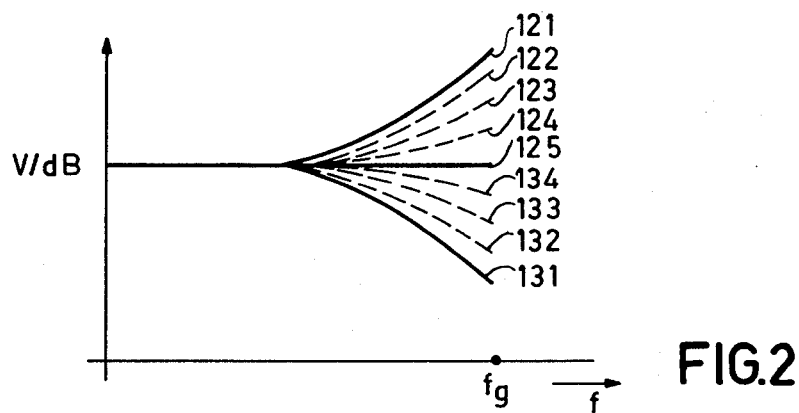
FIG. 2 represents the frequency response for various positions of the two switches.
Figure 3A:
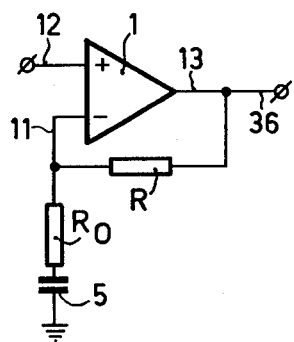
FIGS. 3a to 3c represent equivalent diagrams of the circuit arrangement of FIG. 1 for various switch positions.

In the switch position shown, in which the output of the circuit arrangement is connected directly to the output of the amplifier via the switch 3 and in which the output 26 is connected to the tapping 21 at the lower end of the resistor chain, the equivalent diagram of FIG. 3a is obtained. The resistance R between the output of the amplifier and its inverting input corresponds to the sum of the values of the dividing resistors 42 ... 45 of the resistor network 4. The resistance $R_o$, which is low in comparison with R and which serves to limit the treble boost or reduction, corresponds to the value of the resistor 41 and is included in series with the capacitor 5 between the inverting input 11 and ground. At comparatively low frequencies the impedance of the capacitance 5 is high in comparison with the impedance of the resistance R, so that the signal at the inverting input 11 substantially corresponds to the signal at the output of the amplifier 1. In this case a voltage gain of 1 or 0 dB is obtained. At higher frequencies the impedance of the capacitor 5 may no longer be ignored in comparison with the resistance R, so that the negative feedback decreases which corresponds to an increase of the gain at higher frequencies (treble boost). Thus, the gain as a function of the frequency will vary as represented in FIG. 2 by the uninterrupted line 121.

Figure 3B:
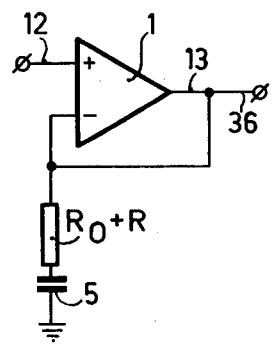

If with the same position of the switch 3, the position of the switch 2 is changed so that consecutively the inputs 22, 23, 24 and 25 are connected to the output 26 of the switch 2, the resistance $R_o$ will increase stepwise while the resistance R will decrease by the same amount. Thus, at the higher frequencies the negative feedback will increase continually, that is the boost at the higher frequencies will be reduced continually, as is represented by the broken lines 122 ... 124. If, finally, the input 25 of the switch 2, which input is connected to the output 13 of the amplifier 1, is connected to the switch output 26, the equivalent diagram shown in FIG. 3b is obtained. The resistance $R_o+R$ then corresponds to the sum of the values of the resistors 41 ... 45. The full output voltage is then always fed back to the amplifier input so that the resulting characteristic (continuous line 125) is perfectly linear if the internal resistance of the amplifier is substantially smaller than the impedance existing at the output.

Figure 3C:
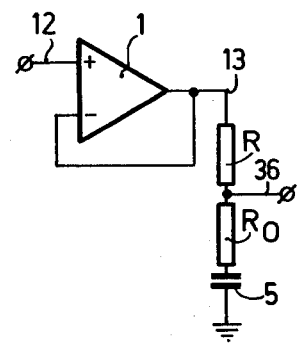

If, in contradistinction to the switch position shown in FIG. 1, the input 25 of the switch 2 is connected to its output 26 and the input 31 of the switch 3 to the output 36, the equivalent diagram of FIG. 3c is obtained, the resistance R again corresponding to the sum of the values of the resistors 42 ... 45 and the resistance $R_o$ corresponding to the value of the resistor 41. Since, as already stated, the impedance of the capacitor 5 at low frequencies is high in comparison with the resistance R, the output signal of the amplifier 13 appears substantially unchanged on the output terminal 36 of the circuit arrangement. At higher frequencies, however, the resistance R is no longer negligible in comparison with the impedance of the capacitor 5, so that a decrease of the gain at higher frequencies is obtained, as is represented by the continuous line 131 in FIG. 2. The resistance $R_o$, which corresponds to the dividing resistor 41 of the resistor chain 4, then prevents an excessive reduction of the gain at high frequencies. If the switch 3 is now changed over, so that consecutively the inputs 32, 33 and 34 are connected to the output 36 of the switch 3 (the input 25 of the switch 2 remaining connected to its output 26), the resistance $R_o$ in the equivalent diagram of FIG. 3c increases continually, while the resistance R is reduced, so that the gain reduction at higher frequencies decreases continually, as is represented by the broken lines 132 ... 134 in FIG. 2. In the upper position of the switch 3 the equivalent diagram of FIG. 3b and the frequency independence of the gain represented by the line 125 are obtained again.

In addition to the switch positions described, other positions are possible. For example, the inputs 23 and 33, to which the tapping 53 is connected, may be connected to the outputs 26 and 36 of the respective switches 2 and 3, but then the treble reduction and treble boost exactly compensate for each other, so that again a linear frequency response is obtained. In other switch positions only a partial compensation is obtained, so that either a treble boost or a treble reduction is obtained, but the variation of the frequency response still varies between the limits 121 and 131, so that these switch positions are superfluous.

When the dividing resistors 41 ... 45 and the capacitor 5 are suitably dimensioned, it can be achieved that the gain at an upper limit frequency $f_g$, for example at 20 kHz, at the transition from one of the characterisics shown in FIG. 2 to the adjacent characteristic each time varies by for example 3 dB. For the specified gain variation of 3 dB treble boosts or reductions of each time ±12 dB can be obtained with the circuit arrangement shown in FIG. 1. When even greater boosts or reductions are required, without the gain variation being increased, a resistor chain with more dividing resistors may be employed.

As already stated, the switches 2 and 3 are changed over by digital data words on their respective inputs 27 and 37. Such switches are known, for example in the form of the integrated circuit Philips TDA 1029, which, however, is designed for switching over from four inputs to two outputs. A greater number of switching possibilities is obtained by cascading, as is for example described in the magazine "Technische Informationen für die Industrie" No. 780530 (FIG. 23) published by the Valvo company. The two 5-bit data words required for controlling the switches 2 and 3 are supplied by a decoder circuit 6, which converts a four-bit data word appearing on its input 62 into a ten-bit data word, of which five bits each are applied to the control inputs 27 and 37 of switches 2 and 3. The decoder circuit may comprise a memory with a number of ten-bit storage locations corresponding to the number of possible switch positions (nine), which locations are addressed by the signal on the input line 62. It may alternatively comprise a logic circuit comprising gates which produces a ten-bit data word on the output for each four-bit data word on the input.

The inputs 62 of the decoder circuit 6 are connected to the output of a memory 7, whose content determines the position of the switches 2 and 3. The memory 7 may for example be an up-down counter which can count to nine and whose counting direction can be controlled by the user via the unit 8. Consecutive counts are assigned to the switch positions, which correspond to adjacent characteristics, for example the characteristic 133 and 134 in FIG. 2, so that during a count-up (down) cycle the characteristics 121 to 131 (FIG. 2) are covered quasi-continuously in the one or the other direction.

However, the memory 7 may also be controlled by a microprocessor. If said microprocessor serially supplies the four bits of a data word, a shift register is required into which the data supplied by the microprocessor is loaded, which data is then transferred in parallel to the memory 7.

The circuit arrangement described produces less noise than the known circuit arrangements because both the amplifier 1 and the switches 2 and 3 can operate without the current-distribution principle. The treble boost and reduction curves are exactly mirror-inverted relative to each other because for both functions the same resistor chain and the same capacitor are used. If the circuit arrangement shown in FIG. 1 is manufactured as an integrated circuit, all the elements shown, except for the capacitor 5, can be integrated on one chip. Thus, only one external circuit element (the capacitor 5) need be connected to such an integrated circuit and for this purpose only one external connection (pin) is needed.

What is claimed is:

1. A circuit arrangement for transferring signals over a frequency spectrum having a low frequency end and a high frequency end and which includes means for adjusting its frequency transfer characteristic at the high frequency end comprising, an amplifier with variable frequency-dependent negative feedback and having an inverting and a non-inverting input, a signal input terminal coupled to the non-inverting input of said amplifier, a signal output terminal, an arrangement including a capacitor connected in series with a resistor chain voltage divider having a plurality of tappings, means connecting said series arrangement between an output of the amplifier and a point of reference voltage, a first switch which selectively couples said tappings on the resistor chain to the inverting input of the amplifier, and a second switch which selectively couples each of said tappings on the resistor chain to the signal output terminal independently of the setting of the first switch.

2. A circuit arrangement as claimed in claim 1 further comprising means for controlling the two switches such that at all times at least one of the two switches has its output coupled to receive the full output voltage of the amplifier.

3. A circuit arrangement as claimed in claims 1 or 2 wherein each of the switches comprise a semiconductor circuit having a plurality of control inputs wherein the switch position can be controlled by means of a digital data word applied to said control inputs.

4. A circuit arrangement as claimed in claim 3, further comprising a memory circuit coupled to the control inputs of the switches and with the data words for the control inputs of the switches stored in said memory circuit.

5. A circuit arrangement as claimed in claim 1 wherein the capacitance value of said capacitor is chosen so that the impedance of the capacitor at the low frequency end of the frequency spectrum is substantially higher than the resistance value of the resistor chain such that a relatively flat frequency transfer characteristic is produced over the low frequency end of the frequency spectrum.

6. A circuit arrangement as claimed in claim 1 adapted for use as a treble control device in an audio amplifier wherein the resistor chain comprises n dividing resistors and each of said switches has n inputs, and means for controlling said switches so as to provide only 2n-1 switch positions that cover the entire range of control from treble boost through treble attenuation.

7. A treble control device for controlling the frequency transfer characteristic of a circuit arrangement at the high end of the audio frequency spectrum comprising, an audio signal input terminal and an output terminal, an amplifier having a non-inverting input coupled to said input terminal and an inverting input and an output, a capacitor connected in series circuit with a resistor chain voltage divider having a plurality of tappings, means coupling said series circuit to the output of the amplifier, first switching means for selectively coupling each of said tappings on the resistor chain to the inverting input of the amplifier to provide a variable frequency-dependent negative feedback for the amplifier, second switching means for selectively coupling each of said tappings on the resistor chain to the signal output terminal, and digital means for controlling said first and second switching means so that for all possible switch positions either the amplifier inverting input or the signal ouput terminal are coupled to the tapping electrically closest to the amplifier output.

8. A device for controlling the frequency transfer characteristic of a circuit arrangement at the high end of a given frequency spectrum comprising, a signal input terminal and an output terminal, an amplifier having a non-inverting input coupled to said input terminal and an inverting input and an output, a capacitor connected in series circuit with a single voltage divider including a plurality of series connected resistors having a plurality of tappings, means coupling said series circuit of the voltage divider and capacitor between an output of the amplifier and a point of reference voltage, first electronic switching means for selectively coupling the amplifier inverting input to said tappings on the voltage divider to provide a variable frequency-dependent negative feedback for the amplifier, second electronic switching means for selectively coupling the signal output terminal to said tappings on the voltage divider, and means for controlling the operation of said first and second electronic switching means thereby to control the circuit frequency transfer characteristic.

9. A device as claimed in claim 8 wherein the series circuit of the voltage divider and the capacitor are directly connected between the amplifier output and the point of reference voltage in the order named.

* * * * *

UNITED STATES PATENT AND TRADEMARK OFFICE
CERTIFICATE OF CORRECTION

PATENT NO. : 4,451,795
DATED : May 29, 1984
INVENTOR(S) : ERNST A. KILIAN

It is certified that error appears in the above-identified patent and that said Letters Patent is hereby corrected as shown below:

The Title Page:

Please change the Priority Date from "Aug. 10, 1980" to --Oct. 8, 1980--

Signed and Sealed this

Twenty-seventh Day of August 1985

[SEAL]

*Attest:*

DONALD J. QUIGG

*Attesting Officer*     Acting Commissioner of Patents and Trademarks